(12) United States Patent
Tomori et al.

(10) Patent No.: US 11,195,728 B2
(45) Date of Patent: Dec. 7, 2021

(54) TEMPORARY PROTECTIVE FILM FOR SEMICONDUCTOR SEALING MOLDING

(71) Applicant: HITACHI CHEMICAL COMPANY, LTD., Tokyo (JP)

(72) Inventors: Naoki Tomori, Tokyo (JP); Tomohiro Nagoya, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 0 days.

(21) Appl. No.: 16/612,106

(22) PCT Filed: Jan. 25, 2018

(86) PCT No.: PCT/JP2018/002313
§ 371 (c)(1),
(2) Date: Nov. 8, 2019

(87) PCT Pub. No.: WO2018/207408
PCT Pub. Date: Nov. 15, 2018

(65) Prior Publication Data
US 2020/0118841 A1    Apr. 16, 2020

(30) Foreign Application Priority Data

May 10, 2017 (JP) .............................. JP2017-094157

(51) Int. Cl.
*H01L 23/29* (2006.01)
*H01L 21/56* (2006.01)
*H01L 23/498* (2006.01)
*H01L 23/00* (2006.01)

(52) U.S. Cl.
CPC ............ *H01L 21/568* (2013.01); *H01L 23/29* (2013.01); *H01L 23/49811* (2013.01); *H01L 23/49861* (2013.01); *H01L 24/29* (2013.01); *H01L 24/45* (2013.01); *H01L 24/83* (2013.01); *H01L 24/85* (2013.01)

(58) Field of Classification Search
CPC . H01L 21/568; H01L 23/29; H01L 23/49811; H01L 23/49861; H01L 24/49; H01L 24/45; H01L 24/83; H01L 24/85
See application file for complete search history.

(56) References Cited

U.S. PATENT DOCUMENTS

2003/0145949 A1* 8/2003 Tanaka ................. C09J 133/068
                                                            156/330
2014/0252646 A1* 9/2014 Hung ..................... H01L 21/486
                                                            257/774

FOREIGN PATENT DOCUMENTS

| JP | WO01/35460    | * | 5/2001 |
| JP | 2005-116919 A |   | 4/2005 |
| JP | 2008-131006 A |   | 6/2008 |
| JP | 2009-044010 A |   | 2/2009 |
| WO | 01/035460 A1  |   | 5/2001 |

* cited by examiner

*Primary Examiner* — Timor Karimy
(74) *Attorney, Agent, or Firm* — Fitch, Even, Tabin & Flannery, LLP (57) ABSTRACT

Disclosed is a temporary protective film for semiconductor sealing molding 10 including a support film 1; and an adhesive layer 2 provided on the support film 1 and containing an acrylic rubber. A solid shear modulus at 200° C. of the temporary protective film for semiconductor sealing molding 10 may be 5.0 MPa or higher.

14 Claims, 4 Drawing Sheets

TEMPORARY PROTECTIVE FILM FOR SEMICONDUCTOR SEALING MOLDING

CROSS-REFERENCE TO RELATED APPLICATIONS

This application is a U.S. national phase application filed under 35 U.S.C. § 371 of International Application No. PCT/JP2018/002313, filed Jan. 25, 2018, designating the United States, which claims priority from Japanese Patent Application No. 2017-094157, filed May 10, 2017, which are hereby incorporated herein by reference in their entirety.

TECHNICAL FIELD

The present invention relates to a temporary protective film for semiconductor sealing molding. The present invention also relates to a temporary protective film-attached lead frame, a temporary protective film-attached sealing molded body, and a method for producing a semiconductor device.

BACKGROUND ART

Conventionally, semiconductor packages having a structure in which a semiconductor element is adhered onto a die pad by means of an adhesive such as a silver paste, this is joined to a lead frame with a wire, and then the entirety is sealed while an outer lead for external connection is left, have been used. However, as there is a stronger demand for density increase, area reduction, thickness reduction, and the like of the semiconductor packages in recent years, semiconductor packages having various structures have been suggested. As such a semiconductor package, semiconductor packages having a structure in which only one surface (semiconductor element side) of the package is sealed, and a lead frame having its rear surface exposed is used for external connection, have been developed (for example, QuadFlat Non-leaded (QFN) package). In a semiconductor package having this structure, since a lead frame is not protruded from the sealing resin, area reduction and thickness reduction can be promoted. However, there are occasions in which a defect of a sealing resin wrapping around the rear surface of a lead frame at the time of sealing molding may occur.

As a method of preventing such a defect, a method of attaching an adhesive film for semiconductor as a temporary protective film to the rear surface of a lead frame to protect the rear surface of the lead frame, sealing molding a semiconductor element mounted on the lead frame front surface side, and then tearing off the temporary protective film, is known (for example, Patent Literature 1).

CITATION LIST

Patent Literature

Patent Literature 1: WO 2001/035460

SUMMARY OF INVENTION

Technical Problem

It is desirable that a temporary protective film used for semiconductor sealing molding can be attached to a lead frame at low temperature such as normal temperature conditions and is conveniently and easily peeled off after sealing. However, for example, the adhesive film for semiconductor of Patent Literature 1 requires high temperature and high pressure conditions (for example, 200° C. to 250° C., 3 to 8 MPa) in order to be attached to the rear surface of a lead frame, and it is difficult to attach the adhesive film under normal temperature conditions (conditions in which the temperature is not applied intentionally, for example, 24° C.).

Furthermore, it is preferable that the adhesive film for semiconductor of Patent Literature 1 is subjected to a heating treatment for peeling after sealing. On the other hand, in the case of a film having relatively satisfactory attachment properties at normal temperature, there is room for improvements in view of peelability after sealing molding, such as that there are occasions in which adhesive residue is produced on the lead frame side at the time of peeling from a lead frame and a sealing material after sealing.

Thus, it is an object of the present invention to provide a temporary protective film for semiconductor sealing molding, which can be attached to a lead frame at normal temperature and can also be easily peeled off from the lead frame and a sealing layer, while suppressing adhesive residue, after sealing molding.

Solution to Problem

The inventors of the present invention conducted a thorough investigation in order to solve the problems described above, and as a result, the inventors found that the problems can be solved by using a particular adhesive layer, thus completing the present invention.

An aspect of the present invention relates to a temporary protective film for semiconductor sealing molding, the temporary protective film including a support film and an adhesive layer provided on the support film and containing an acrylic rubber, in which a solid shear modulus at 200° C. of the temporary adhesive film is 5.0 MPa or higher.

The adhesive layer may further contain a peelability imparting agent. A content of the peelability imparting agent may be more than or equal to 10 parts by mass and less than 60 parts by mass with respect to 100 parts by mass of the acrylic rubber.

A thickness of the adhesive layer may be from 1 μm to 5 μm.

The support film may be a polyimide film.

The acrylic rubber may be a copolymer including at least one monomer unit selected from the group consisting of butyl (meth)acrylate, ethyl (meth)acrylate, methyl (meth)acrylate, (meth)acrylic acid, acrylonitrile, 2-hydroxyethyl (meth)acrylate, and glycidyl (meth)acrylate. A weight average molecular weight of the acrylic rubber may be from 450,000 to 900,000.

The adhesive layer may have pressure-sensitive adhesiveness at 24° C. The 5% weight reduction temperature of the temporary protective film may be 350° C. or higher.

The temporary protective film for semiconductor sealing molding may be a temporary protective film for semiconductor sealing molding further including a cover film provided on a surface of the adhesive layer, the surface being on the opposite side of the surface having the support film provided thereon.

Furthermore, an aspect of the present invention relates to a temporary protective film-attached lead frame including a lead frame having a die pad and an inner lead; and the temporary protective film for semiconductor sealing molding, in which the temporary protective film is attached to the lead frame such that the adhesive layer of the temporary protective film comes into contact with one surface of the lead frame.

Furthermore, an aspect of the present invention relates to a temporary protective film-attached sealing molded body including a lead frame having a die pad and an inner lead; a semiconductor element mounted on the die pad; a wire connecting the semiconductor element and the inner lead; a sealing layer sealing the semiconductor element and the wire; and the temporary protective film for semiconductor sealing molding, in which the temporary protective film is attached such that the adhesive layer of the temporary protective film is attached to a surface of the lead frame, the surface being on the opposite side of the surface having the semiconductor element mounted thereon.

Furthermore, an aspect of the present invention relates to a method for producing a semiconductor device, the method including: attaching the above-described temporary protective film for semiconductor sealing molding to one surface of a lead frame having a die pad and an inner lead in a direction of the adhesive layer coming into contact with the lead frame; mounting a semiconductor element on a surface of the die pad on the opposite side of the temporary protective film; providing a wire for connecting the semiconductor element and the inner lead; forming a sealing layer for sealing the semiconductor element and the wire, and thereby obtaining a sealing molded body having a lead frame, a semiconductor element, and a sealing layer; and peeling off the temporary protective film from the sealing molded body.

In a case in which the lead frame has a plurality of die pads, and the semiconductor element is mounted on each of the multiple die pads, the method for producing a semiconductor device may further include dividing the sealing molded body before or after the temporary protective film is peeled off from the sealing molded body, and thereby obtaining a semiconductor device having one die pad and one semiconductor element.

Advantageous Effects of Invention

According to the present invention, a temporary protective film for semiconductor sealing molding that can be attached to a lead frame at normal temperature and can also be easily peeled off from the lead frame and a sealing material after sealing molding while having any adhesive residue inhibited at the time of peeling, can be provided.

DESCRIPTION OF EMBODIMENTS

Hereinafter, suitable embodiments of the present invention will be described in detail. However, the present invention is not intended to be limited to the following embodiments. The upper limits and the lower limits of the value ranges described in the present specification can be arbitrarily combined. The values described in Examples can also be used as the upper limits or lower limits of value ranges.

According to the present specification, the term "(meth) acrylic acid" means "acrylic acid" and "methacrylic acid".

<Temporary Protective Film>

Figure 1:
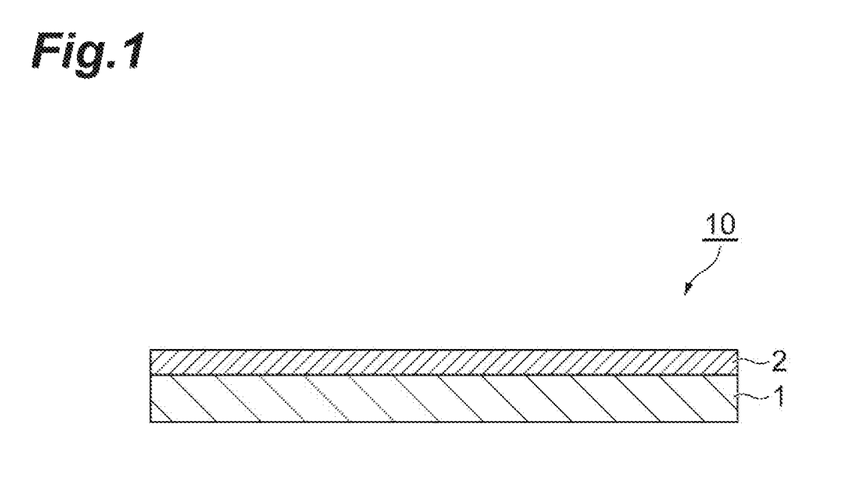
FIG. 1 is a cross-sectional view illustrating an embodiment of a temporary protective film.
Figure 2:
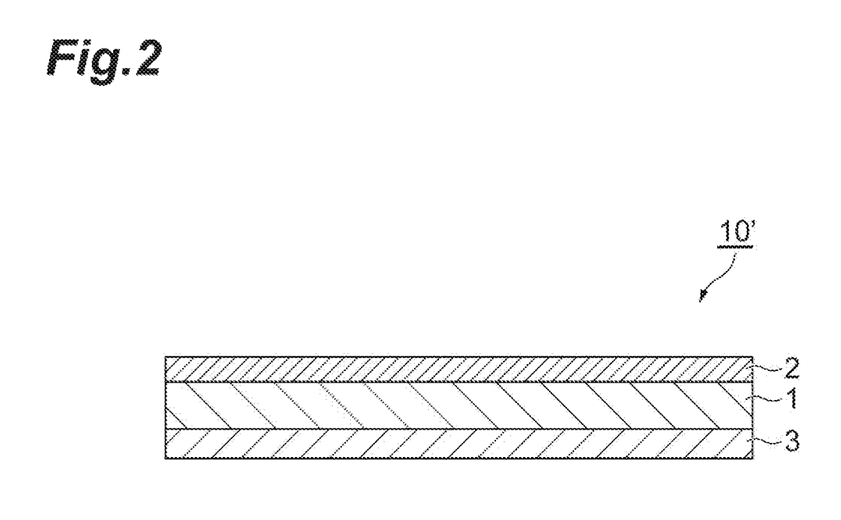
FIG. 2 is a cross-sectional view illustrating an embodiment of a temporary protective film.

FIG. 1 is a cross-sectional view illustrating a temporary protective film according to an embodiment. The temporary protective film 10 illustrated in FIG. 1 is composed of a support film 1; and an adhesive layer 2 provided on one surface of the support film 1. An adhesive layer may be formed on both surfaces of the support film 1. FIG. 2 is also a cross-sectional view illustrating a temporary protective film according to an embodiment. The temporary protective film 10' of FIG. 2 has a support film 1; an adhesive layer 2 provided on one of the principal surfaces of the support film 1; and a resin layer (non-adhesive layer 3) that is provided on the other principal surface of the support film 1 and substantially does not have adhesiveness. Such a temporary protective film can be used, in a process for sealing molding of forming a sealing layer that seals a semiconductor element mounted on a lead frame, as a temporary protective film for semiconductor sealing molding for temporarily protecting the lead frame during sealing molding, by attaching the temporary protective film to the rear surface (surface on the opposite side of the surface where a semiconductor element is mounted) of the lead frame.

<Adhesive Layer>

The adhesive layer contains an acrylic rubber. An acrylic rubber is generally a copolymer including a (meth)acrylic acid ester as a monomer unit. The acrylic rubber is, for example, a copolymer obtainable by a polymerization reaction of a monomer mixture including a (meth)acrylic acid ester and another monomer such as (meth)acrylic acid, an aromatic vinyl compound, or a vinyl cyanide compound.

Examples of the (meth)acrylic acid ester that constitutes the acrylic rubber include butyl (meth)acrylate (for example, n-butyl (meth)acrylate), ethyl (meth)acrylate, and methyl (meth)acrylate. The (meth)acrylic acid ester may be, for example, a compound having a reactive functional group, such as 2-hydroxyethyl (meth)acrylate or glycidyl (meth) acrylate. However, it is desirable that the acrylic rubber is a copolymer including at least one (meth)acrylic acid ester selected from the group consisting of butyl (meth)acrylate, ethyl (meth)acrylate, and methyl (meth)acrylate as a main component of monomer units. In this case, since there are few functional groups in the side chains of the acrylic rubber, the reaction between the functional groups and the adherend surface caused by a heat treatment is suppressed, and the peelability of the adhesive layer from the adherend becomes more satisfactory. Furthermore, when an acrylic rubber including a monomer having a linear hydrocarbon group as a monomer unit is used, the wetting spreadability of the adhesive layer to the adherend tends to become satisfactory. Here, the "main component" refers to a monomer unit occupying 50% by mass or more with respect to the total mass of the copolymer.

Examples of the other monomer constituting the acrylic rubber include (meth)acrylic acid and acrylonitrile.

In a case in which the acrylic rubber includes at least one selected from the group consisting of (meth)acrylic acid and 2-hydroxyethyl (meth)acrylate as a monomer unit, the acrylic rubber may have a carboxy group and/or a hydroxy group. This carboxy group and/or hydroxy group can be utilized in a reaction with the peelability imparting agent that will be described below.

The glass transition temperature (Tg) of the acrylic rubber may be −50° C. to 40° C., −40° C. to 30° C., or −30° C. to 20° C., from the viewpoint of maintaining the attachability of the adhesive layer at normal temperature. In a case in which the glass transition temperature of the acrylic rubber is −50° C. or higher, since wettability is decreased by a heat treatment, deterioration of peelability tends to be relatively suppressed. In a case in which the glass transition temperature of the acrylic rubber is 20° C. or lower, the reduction of attachability at normal temperature tends to be relatively suppressed. Here, the glass transition temperature of the acrylic rubber is not particularly limited; however, generally, the glass transition temperature means a value measured by differential scanning calorimetric measurement, differential thermal analysis, dynamic viscoelasticity measurement, or thermomechanical analysis.

It is also acceptable that the acrylic rubber is a copolymer including at least one monomer unit selected from the group consisting of butyl (meth)acrylate, ethyl (meth)acrylate, and methyl (meth)acrylate as a main component, and the glass transition temperature of the acrylic rubber is −30° C. to 20° C. In this case, wetting spreadability to the adherend becomes satisfactory, and both adhesiveness and peelability can be achieved at a particularly high level.

The weight average molecular weight of the acrylic rubber may be 400,000 or more, 450,000 or more, or 700,000 or more, from the viewpoint of retaining low outgas emission and cohesive force. The weight average molecular weight of the acrylic rubber is not particularly limited; however, the weight average molecular weight may be 900,000 or less. The weight average molecular weight of the acrylic rubber as used herein means a value measured by gel permeation chromatography (value calculated relative to polystyrene standards).

Regarding the acrylic rubber, a product purchased as a commercially available product may be used. Examples of a commercially available product of the acrylic rubber include HTR-280 DR (manufactured by Nagase ChemteX Corp., weight average molecular weight 800,000 to 900,000) and WS-023 EK30 (manufactured by Nagase ChemteX Corp., weight average molecular weight 450,000 to 500,000). These acrylic rubbers may be used singly, or two or more kinds thereof may be used in combination.

The content of the acrylic rubber in the adhesive layer may be 50% by mass or more, 60% by mass or more, 70% by mass or more, or 80% by mass or more, based on the mass of the adhesive layer, and may be 100% by mass or less.

An adhesive layer containing an acrylic rubber can have satisfactory attachability at normal temperature. In other words, the adhesive layer can have pressure-sensitive adhesiveness without intentionally applying a temperature, for example, at 24° C. The phrase "have pressure-sensitive adhesiveness at 24° C." means that in a case in which the adhesive layer (having a size of 40 mm×160 mm) and a lead frame (having a size of 50 mm×157 mm) are pressure-bonded under a load of 20 N without intentionally applying a temperature, for example, under the conditions of a temperature of 24° C., the adhesive force of the adhesive layer to the lead frame is 5 N/m or more. Meanwhile, this adhesive force can be measured by the method described in the Examples that are described below.

The solid shear modulus at 200° C. (hereinafter, also simply referred to as "solid shear modulus") of the temporary protective film is 5.0 MPa or higher. The solid shear modulus at 200° C. of the temporary protective film may be 6 MPa or higher, 8 MPa or higher, or 10 MPa or higher, and may be 25 MPa or lower, or 20 MPa or lower. When the solid shear modulus of the temporary protective film is in these ranges, adhesive residue on the lead frame and the sealing layer after sealing molding is further suppressed.

The solid shear modulus as used herein means a value obtained by setting a specimen of a temporary protective film having a size of 5 mm×8 mm on a solid shear measuring jigs and making a measurement using a dynamic viscoelasticity measuring apparatus (for example, Rheogel-E4000 manufactured by UBM Co., Ltd.) under the conditions of a sinusoidal wave, 30° C. to 250° C., a rate of temperature increase of 5° C./min, and a frequency of 400 Hz. As the specimen, a laminate formed from a support film and an adhesive layer is used.

Here, in the production of a semiconductor device, a wire bonding process is carried out, for example, under the conditions of utilizing ultrasonic waves and a pressing pressure while heating for 3 to 60 minutes at 200° C. to 270° C. In a wire bonding process under these conditions, since the adhesive layer becomes soft, a defect that wires cannot be disposed correctly may occur. Furthermore, a defect that the outgas generated by thermal decomposition of the adhesive layer contaminates the semiconductor element and inner lead surfaces may also occur. In a case in which the solid shear modulus of the temporary protective film is in the above-mentioned range, these defects in the wire bonding process are further suppressed.

As the thickness (film thickness) of the adhesive layer is thinner, the solid shear modulus tends to increase. For example, for an adhesive layer containing an acrylic rubber, the solid shear modulus at 200° C. of the temporary provisional film can be easily adjusted to 5.0 MPa or higher by regulating the thickness to the range of 1 to 5 μm.

The thickness of the adhesive layer may be adjusted to 5 μm or less, or 3 μm or less, from the viewpoint of suppressing or preventing defects at the time of wire bonding (for example, non-adhesion of wires, wire breaking, and lack of the adhesive strength of wires). From a similar point of view, the thickness (film thickness) of the adhesive layer may be 1 μm or more, or 2 μm or more.

The adhesive layer may further contain a peelability imparting agent. A peelability imparting agent is a component that lowers the adhesive force of the adhesive layer after sealing molding to the lead frame and/or the sealing layer, compared to the case in which the adhesive layer does not contain the agent.

As the peelability imparting agent, an aliphatic compound can be used. An aliphatic compound is a compound having a linear, branched, or alicyclic hydrocarbon group. The aliphatic compound may have at least one functional group selected from the group consisting of an epoxy group and a hydroxy group, and may have an epoxy group. In other words, the peelability imparting agent may be an aliphatic epoxy resin. Furthermore, the aliphatic compound may be water-soluble. From the above-described point of view, the peelability imparting agent may include an aliphatic epoxy resin having a hydrocarbon group containing a main chain with two or more carbon atoms, which may have a side chain (branch), and an epoxy group bonded to the terminals of the main chain. Specifically, the peelability imparting agent may include at least one aliphatic compound (or aliphatic epoxy resin) selected from the group consisting of (poly)ethylene glycol diglycidyl ether, sorbitol polyglycidyl ether, and glycerol polyglycidyl ether. These aliphatic compounds may be used singly, or two or more kinds thereof may be used in combination; however, from the viewpoint of further suppressing adhesive residue, two or more kinds thereof may be used in combination.

In a case in which the acrylic rubber includes at least one selected from the group consisting of (meth)acrylic acid and 2-hydroxyethyl acrylate as a monomer unit, and an aliphatic compound having an epoxy group is used as a peelability imparting agent, peelability from the lead frame and the sealing layer becomes more satisfactory, and also, the washing treatment in the case in which the adhesive layer remains on the lead frame and the sealing layer is achieved more efficiently. This is speculated to be because cleanability is increased by a reaction between an epoxy group of the peelability imparting agent and a hydroxy group and/or a carboxy group in a side chain of the acrylic rubber, by means of the peelability imparting agent that is originally a low molecular weight compound compared to the acrylic rubber and has solubility.

The content of the peelability imparting agent may be 6 parts by mass or more, or 10 parts by mass or more, with respect to 100 parts by mass of the acrylic rubber, and may be less than 60 parts by mass, 50 parts by mass or less, or 30 parts by mass or less. In a case in which the content of the peelability imparting agent is less than 60 parts by mass, a decrease in the adhesiveness between the adhesive layer and the support film is suppressed, and there is a tendency that the adhesive layer is not easily peeled off. In a case in which the content of the peelability imparting agent is 6 parts by mass or more, securement of sufficient peelability and cleanability tends to be achieved more easily.

The adhesive layer may further contain other components as necessary. Examples of the other components include an amino alkyd resin and fatty acids.

The adhesive force of the adhesive layer to the lead frame and the sealing layer may be 450 N/m or less after sealing molding, or may be 300 N/m or less. The adhesive force to the lead frame and the sealing layer after sealing molding can be measured according to the method described in Examples that will be described below.

The 5% weight reduction temperature of the temporary protective film may be 350° C. or higher. Thereby, the amount of outgas is reduced, and the wire bondability becomes more satisfactory. The 5% weight reduction temperature of the temporary protective film may be 500° C. or lower, or may be 450° C. or lower. The 5% weight reduction temperature can be measured using a differential thermal balance (for example, manufactured by Seiko Instruments, Inc., SSC5200 type) under the conditions of a rate of temperature increase of 10° C./min in an air atmosphere.

<Support Film>

The support film is not particularly limited; however, the support film may be a heat-resistant resin film. In the case of using a heat-resistant resin film as the support film, the support film is not softened even under high temperature conditions (for example, 200° C. or higher), and the workability becomes superior. Specifically, the glass transition temperature (Tg) of the support film may be 200° C. or higher, or 250° C. or higher, from the viewpoint of enhancing heat resistance.

Examples of the heat-resistant resin that constitutes the support film include an aromatic polyimide, an aromatic polyamide, an aromatic polyamideimide, an aromatic polysulfone, an aromatic polyethersulfone, polyphenylene sulfide, an aromatic polyether ketone, polyallylate, an aromatic polyether ether ketone, polyethylene naphthalate, and polyethylene terephthalate.

The support film may be a polyimide film, from the viewpoint that the support film has heat resistance, and the adhesiveness to the adhesive layer can be further enhanced. In a case in which a polyimide resin film is used as the support film, the polyimide film may be subjected to a high tight adhesion treatment such as a plasma treatment, a corona treatment, or a primer treatment. In a case in which the tight adhesiveness of the support film to the adhesive layer is low, when the temporary protective film is torn off from the lead frame and the sealing layer, peeling occurs at the interface between the adhesive layer and the support film, and the adhesive layer is likely to remain on the side of the lead frame and the sealing layer. Therefore, it is preferable that the support film has sufficiently high tight adhesiveness to the adhesive layer.

The thickness (film thickness) of the support film is not particularly limited; however, from the viewpoint of reducing the residual stress that is related to warpage of the lead frame after the temporary protective film is attached to the lead frame, the thickness may be 100 µm or less, 50 µm or less, or 25 µm or less. The thickness of the support film may be 5 µm or more, or 10 µm or more.

In regard to the temporary protective film according to an embodiment, the thickness of the support film is from 5 µm to 50 µm, and the thickness of the adhesive layer may be from 1 µm to 5 µm.

<Cover Film>

The temporary protective film for semiconductor sealing molding may include a cover film provided on a surface of the adhesive layer, the surface being on the opposite side of the surface having the support film provided thereon. That is, the temporary protective film for semiconductor sealing molding may be in the form of a cover film-attached temporary protective film for semiconductor sealing molding. The cover film is not particularly limited; however, the cover film may be a polyethylene terephthalate film, or may be a polyethylene terephthalate film provided with a peeling layer.

The thickness of the cover film may be from 10 µm to 100 µm, or from 20 µm to 100 µm.

A non-adhesive layer 3 carried by the temporary protective film 10' according to the embodiment of FIG. 2 is a resin layer that substantially does not have adhesiveness (or pressure-sensitive adhesiveness) to the lead frame at 0° C. to 270° C. For example, a resin layer having a high glass transition temperature can function as a non-adhesive layer. Specifically, the non-adhesive layer may be a resin layer containing polyamideimide. The thickness of the non-adhesive layer is not particularly limited; however, the thickness may be 1 to 10 µm.

<Method for Producing Temporary Protective Film>

The temporary protective film according to an embodiment can be produced by, for example, the following method. First, an acrylic rubber, a solvent such as cyclohexanone or methyl ethyl ketone, and optionally other components such as a peelability imparting agent are mixed, and a varnish is produced. The varnish thus produced is applied on one surface of the support film, subsequently the solvent is removed from the coating film by a heating treatment, and thereby an adhesive layer is formed on the support film. Thereby, a temporary protective film having a two-layer structure can be obtained.

The method of applying the varnish on one surface of the support film is not particularly limited; however, for example, roll coating, reverse roll coating, gravure coating, bar coating, comma coating, die coating, or reduced pressure die coating can be used.

<Method for Producing Semiconductor Device>

A semiconductor device can be produced by a method including a sealing molding step for a semiconductor element using the temporary protective film according to an embodiment. The semiconductor device thus produced may be a Non Lead Type Package, which has a lead frame and a semiconductor element mounted thereon; and a sealing layer for sealing the semiconductor element on the semiconductor element side of the lead frame, and in which the rear surface of the lead frame is exposed for external connection. Specific examples thereof include QuadFlat Non-leaded Package (QFN) and Small Outline Non-leaded Package (SON).

Figure 3:
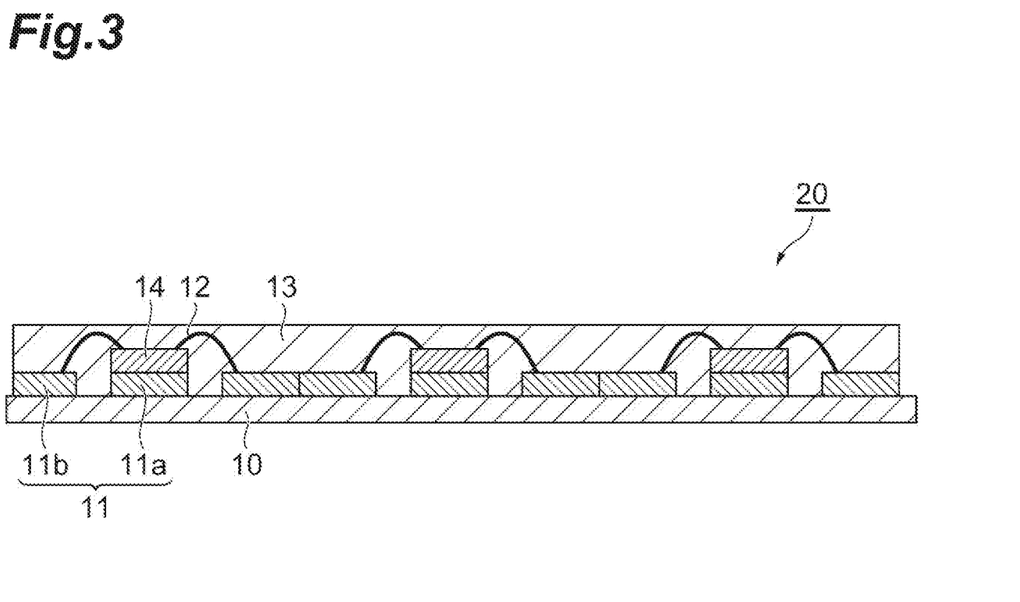
FIG. 3 is a cross-sectional view describing an embodiment of a method for producing a semiconductor device.
Figure 4:
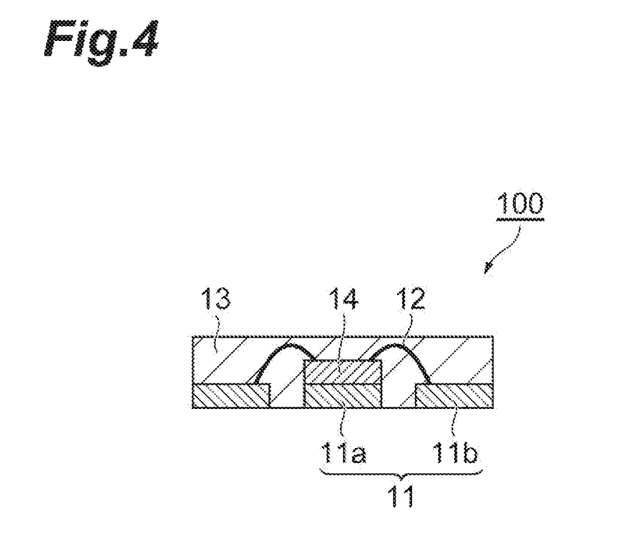
FIG. 4 is a cross-sectional view illustrating an embodiment of a semiconductor device.

FIG. 3 is a cross-sectional view illustrating a method for producing a semiconductor device according to an embodiment. FIG. is a cross-sectional view illustrating an embodiment of a semiconductor device obtainable by the production method of FIG. 3. Hereinafter, various steps will be explained, with reference to the various drawings as necessary.

The method for producing a semiconductor device according to the embodiment of FIG. 3 includes attaching a temporary protective film 10 to one surface (rear surface) of a lead frame 11 having a die pad 11a and an inner lead 11b such that the adhesive layer of the temporary protective film 10 comes into contact with the lead frame; mounting (adhering) a semiconductor element 14 on a surface of the die pad 11a, the surface being on the opposite side of the temporary protective film 10; providing a wire 12 that connects the semiconductor element 14 and the inner lead 11b; forming a sealing layer 13 that seals the semiconductor element 14 and the wire 12 and obtaining a sealing molded body 20 having a lead frame 11, a semiconductor element 14, and the sealing layer 13; and peeling off the temporary protective film 10 from the sealing molded body 20, in this order.

Attachment of the temporary protective film 10 to the lead frame 11 can be carried out at normal temperature (for example, 5° C. to 35° C.). The method of attaching is not particularly limited; however, for example, a roll lamination method is also acceptable.

The temporary protective film-attached lead frame according to an embodiment includes a lead frame 11 having a die pad 11a and an inner lead 11b; and a temporary protective film 10, and the temporary protective film 10 is attached to the lead frame 11 such that the adhesive layer 2 comes into contact with one surface of the lead frame 11.

The material for the lead frame 11 is not particularly limited; however, the material may be, for example, an iron-based alloy such as Alloy 42, gold, copper, or a copper-based alloy. In the case of using lead frames of copper and a copper-based alloy, the surface of the lead frames may be subjected to a coating treatment of palladium, gold, silver, or the like. In order to increase the tight adhesive force to the sealing material, the surface of the lead frame may be physically roughening-treated. The surface of the lead frame may also be subjected to a chemical treatment such as an epoxy bleed-out (EBO) prevention treatment of preventing bleed-out of a silver paste.

The semiconductor element 14 is usually mounted (adhered) on the die pad 11a by means of an adhesive (for example, a silver paste). The adhesive may be cured by a heating treatment (for example, 140° C. to 200° C., 30 minutes to 2 hours).

The wire 12 is not particularly limited; however, the wire may be, for example, a gold wire, a copper wire, or a palladium-coated copper wire. For example, a semiconductor element and an inner lead may be joined with the wire 12 by heating for 3 to 60 minutes at 200° C. to 270° C. and utilizing ultrasonic waves and a pressing pressure.

After wire bonding with the wire 12, and before sealing molding of obtaining a sealing molded body 20 (forming a sealing layer 13), the lead frame 11 may be subjected to a plasma treatment. Through a plasma treatment, the tight adhesiveness between the sealing layer and the lead frame can be further increased, and reliability of the semiconductor device can be further enhanced. Regarding the plasma treatment, for example, a method of injecting a gas such as argon, nitrogen, or oxygen in a predetermined gas flow rate under reduced pressure conditions (For example, 9.33 Pa or less), and irradiating a plasma may be mentioned. The irradiation output of the plasma in the plasma treatment may be, for example, 10 to 500 W. Furthermore, the time for the plasma treatment may be, for example, 5 to 50 seconds. The gas flow rate for the plasma treatment may be 5 to 50 sccm.

In the step of sealing molding, a sealing layer 13 is formed using a sealing material. Through sealing molding, a sealing molded body 20 having a plurality of semiconductor elements 14 and a sealing layer 13 of integrally sealing those semiconductor elements is obtained. Since the temporary protective film 10 is provided during the sealing molding, the sealing material is inhibited from wrapping around the rear surface side of the lead frame 11.

The temporary protective film-attached sealing molded body according to an embodiment includes a lead frame 11 having a die pad 11a and an inner lead 11b; a semiconductor element 14 mounted on the die pad 11a; a wire 12 connecting the semiconductor element 14 and the inner lead 11b; a sealing layer 13 sealing the semiconductor element 14 and the wire 12; and a temporary protective film 10, and the temporary protective film 10 is attached such that the adhesive layer 2 of the temporary protective film is attached to a surface of the lead frame 11, the surface being on the surface where the semiconductor element 14 is mounted.

The temperature during the formation of the sealing layer (sealing temperature) may be 140° C. to 200° C., or may be 160° C. to 180° C. The pressure during the formation of the sealing layer (sealing pressure) may be 6 to 15 MPa, or may be 7 to 10 MPa. The heating time for sealing molding (sealing time) may be 1 to 5 minutes, or may be 2 to 3 minutes.

The sealing layer 13 thus formed may be heated and cured as necessary. The heating temperature for curing of the sealing layer (sealing curing temperature) may be 150° C. to 200° C., or may be 160° C. to 180° C. The heating time for curing of the sealing layer (sealing curing time) may be 4 to 7 hours, or may be 5 to 6 hours.

The material for the sealing material is not particularly limited; however, examples include epoxy resins such as a cresol novolac epoxy resin, a phenol novolac epoxy resin, a biphenyl diepoxy resin, and a naphthol novolac epoxy resin. The sealing material may have, for example, additive materials such as a filler, a flame retardant substance such as a bromine compound, and a wax component added thereto.

After the formation of the sealing layer 13 (sealing molding), the temporary protective film 10 is peeled off from the lead frame 11 and the sealing layer 13 of the sealing molded body 20 thus obtained. In the case of curing the sealing layer, the temporary protective film 10 may be peeled off at any time point before or after curing of the sealing layer.

The temperature at the time of peeling the temporary protective film is not particularly limited; however, the temperature may be normal temperature (for example, 5° C. to 35° C.). This temperature may be higher than or equal to the glass transition temperature of the adhesive layer. In this case, the peelability of the temporary protective film against the lead frame and the sealing material becomes more satisfactory. When the Tg of the acrylic rubber in the adhesive layer is, for example, 5° C. or lower, or 0° C. or lower, the Tg of the adhesive layer becomes equal to or lower than normal temperature, the Tg of the adhesive layer becomes equal to or lower than normal temperature, and satisfactory peelablity at normal temperature is easily obtained.

The method for producing a semiconductor device may further include, if necessary, a process of removing any adhesive layer (adhesive residue) remaining on the lead frame 11 and the sealing layer 13 after the peeling process. In this case, for example, any remaining adhesive layer can be removed using a solvent. Regarding the solvent, for example, dimethyl sulfoxide, ethylene glycol, or water can be used. Regarding the solvent, one kind thereof may be used alone, or two or more kinds thereof may be used as a mixture. A surfactant may be added to the solvent. In a case in which the solvent includes water, the solvent may be a solution adjusted to alkalinity (alkaline solution). The pH of the alkaline solution may be 10 or higher, or may be 12 or higher. Together with the removal by means of a solvent, if necessary, mechanical brushing may be performed. Furthermore, burring and an oxide film of the sealing layer may also be removed.

In a case in which the lead frame includes a plurality of patterns each having a die pad and an inner lead, if necessary, the sealing molded body 20 may be divided, and a plurality of the semiconductor devices 100 of FIG. 4 each having one semiconductor element can be obtained.

That is, in a case in which the lead frame 11 has a plurality of die pads 11a, and a semiconductor element 14 is mounted on each of the multiple die pads 11a, the production method according to an embodiment may further include dividing the sealing molded body 20 before or after the temporary protective film 10 is peeled off from the sealing molded body 20, and thereby obtaining a semiconductor device 100 having one die pad 11a and a semiconductor element 14.

A semiconductor device produced using the temporary protective film according to an embodiment is excellent in view of density increase, area reduction, thickness reduction, and the like, and can be suitably utilized in, for example, electronic equipment such as mobile telephones, smart phones, personal computers, and tablets.

EXAMPLES

Hereinafter, the present invention will be described more specifically by way of Examples; however, the present invention is not intended to be limited to the following Examples.

Production of Temporary Protective Films of Examples 1 to 15 and Comparative Examples 1 to 4

(Production of Varnish for Coating)

To a resin composition having the composition (unit: parts by mass) presented in Table 1 or Table 2, cyclohexanone was added as a solvent, and the mixture was stirred and mixed. Thus, varnishes A to O having 12% by mass of a non-volatile fraction were obtained. The details of the acrylic rubber and the peelability imparting agent shown in the tables are as follows.

Acrylic rubber

Acrylic rubber Ai (manufactured by Nagase ChemteX Corp., trade name: WS-023 EK30, weight average molecular weight: 500,000)

Acrylic rubber Aii (manufactured by Nagase ChemteX Corp., trade name: HTR-280 DR, weight average molecular weight: 900,000)

Peelability imparting agent Bi (manufactured by Nagase ChemteX Corp., trade name: EX-614B, sorbitol polyglycidyl ether, epoxy equivalent: 174)

Peelability imparting agent Bii (manufactured by Nagase ChemteX Corp., trade name: EX-810, ethylene glycol diglycidyl ether, epoxy equivalent: 113)

TABLE 1

| | | | | Varnish | | | | | | | | | |
|---|---|---|---|---|---|---|---|---|---|---|---|---|---|
| | | | | A | B | C | D | E | F | G | H | I | J |
| Composition of adhesive layer (parts by mass) | Acrylic rubber | WS-023 EK30 | Ai | 70 | 70 | 70 | 70 | 70 | 70 | 0 | 100 | 70 | 70 |
| | | HTR-280 DR | Aii | 30 | 30 | 30 | 30 | 30 | 30 | 100 | 0 | 30 | 30 |
| | Peelability imparting agent | EX-614B | Bi | 10 | 10 | 0 | 50 | 30 | 0 | 10 | 10 | 5 | 0 |
| | | EX-810 | Bii | 10 | 0 | 50 | 0 | 0 | 30 | 10 | 10 | 5 | 10 |

TABLE 2

| | | | | Varnish | | | |
|---|---|---|---|---|---|---|---|
| | | | | K | L | M | O |
| Composition of adhesive layer (parts by mass) | Acrylic rubber | WS-023 EK30 | Ai | 70 | 70 | 30 | 0 |
| | | HTR-280 DR | Aii | 30 | 30 | 70 | 100 |
| | Peelability imparting agent | EX-614B | Bi | 0 | 5 | 0 | 30 |
| | | EX-810 | Bii | 0 | 0 | 0 | 10 |

(Production of Temporary Protective Film)

Examples 1 to 13

Each of the varnishes A to M thus obtained was applied on a support film (polyimide film, manufactured by Ube Industries, Ltd., trade name: UPILEX 25SGA, film thickness: 25 μm). The coating film was dried by heating for 2 minutes at 90° C. and for 2 minutes at 150° C., and an adhesive layer having a thickness of 2 μm was formed on the support film. Thus, temporary protective films of Examples 1 to 13 were obtained. For each of the temporary protective films of Example 1 to 13, the solid shear modulus at 200° C. was measured by the following method. The results are presented in Table 3.

Method for Measuring Solid Shear Modulus

A specimen obtained by cutting a temporary protective film into a size of 5 mm×8 mm was mounted on a solid shear measuring jig, and the solid shear modulus was measured using a dynamic viscoelasticity analyzer (manufactured by UBM Co., Ltd., Rheogel-E4000) under the conditions of a sinusoidal wave, 30° C. to 250° C., a rate of temperature increase of 5° C./min, and a frequency of 400 Hz. Meanwhile, the input thickness was fixed to 0.1 mm, and the strain control was set to 1.95 μm and 1.95%. From the measurement results, the solid shear modulus at 200° C. was read out.

Example 14

A temporary protective film of Example 14 was obtained in the same manner as in Example 1, except that the thickness of the adhesive layer was changed to 1 μm. The solid shear modulus at 200° C. of the temporary protective film was 8.2 MPa.

Example 15

A temporary protective film of Example 15 was obtained in the same manner as in Example 1, except that the thickness of the adhesive layer was changed to 5 μm. The solid shear modulus at 200° C. of the temporary protective film was 5.7 MPa.

Comparative Example 1

A temporary protective film of Comparative Example 1 was obtained in the same manner as in Example 1, except that the thickness of the adhesive layer was changed to 6 μm. The solid shear modulus at 200° C. of the temporary protective film was 4.0 MPa.

Comparative Example 2

A temporary protective film of Comparative Example 2 was obtained in the same manner as in Example 1, except that the thickness of the adhesive layer was changed to 8 μm. The solid shear modulus at 200° C. of the temporary protective film was 3.1 MPa.

Comparative Example 3

A temporary protective film of Comparative Example 3 was obtained in the same manner as in Example 1, except that the thickness of the adhesive layer was changed to 10 μm. The solid shear modulus at 200° C. of the temporary protective film was 1.8 MPa.

Comparative Example 4

Varnish O was applied on a support film (manufactured by Du Pont Toray Co., Ltd., trade name: CAPTON 100EN, film thickness: 25 μm). The coating film was dried by heating for 2 minutes at 90° C. and for 2 minutes at 150° C., and an adhesive layer having a thickness of 5 μm was formed on the support film. Thus, a temporary protective film of Comparative Example 4 was obtained. The solid shear modulus at 200° C. of the temporary protective film was 3.2 MPa.

Production of Temporary Protective Film of Comparative Example 5

(Production of Varnish for Coating)

In a 5-liter four-necked flask equipped with a thermometer, a stirrer, a nitrogen inlet tube, and a fractionating column, 270.9 g (0.66 mol) of 2,2-bis[4-(4-aminophenoxy) phenyl]propane and 8.7 g (0.035 mol) of 1,3-bis(3-aminopropyl)-tetramethyldisiloxane were introduced in a nitrogen atmosphere, and these were dissolved in 1,950 g of N-methyl-2-pyrrolidone. Furthermore, this solution was cooled to 0° C., and 149.5 g (0.71 mol) of trimellitic anhydride chloride was added at this temperature. After trimellitic anhydride chloride was dissolved, 100 g of triethylamine was added thereto. Stirring was continued for 2 hours at room temperature, and then the temperature was increased to 180° C. Imidization was completed by a reaction for 5 hours. The reaction liquid was introduced into methanol, and a polymer was isolated. This was dried and then was dissolved in N-methyl-2-pyrrolidone, the solution was introduced into methanol, and the polymer was isolated again. The polymer thus isolated was dried under reduced pressure, and purified polyether amideimide in a powder form was obtained. 120 g of this polyether amideimide and 3.6 g of a silane coupling agent (manufactured by Dow Corning Toray Co., Ltd., trade name: SH6040) were dissolved in 360 g of N-methyl-2-pyrrolidone, and varnish P for adhesive layer formation was obtained.

In a 5-liter four-necked flask equipped with a thermometer, a stirrer, a nitrogen inlet tube, and a fractionating column, 172.4 g (0.42 mol) of 2,2-bis[4-(4-aminophenoxy) phenyl]propane and 153.7 g (0.42 mol) of 4,4'-methylenebis (2,6-diisopropylaniline) were introduced in a nitrogen atmosphere, and these were dissolved in 1,550 g of N-methyl-2-pyrrolidone. Furthermore, this solution was cooled to 0° C., and at this temperature, 174.7 g (0.83 mol) of trimellitic anhydride chloride was added. After trimellitic anhydride chloride was dissolved, 130 g of triethylamine was added. Stirring was continued for 2 hours at room temperature, subsequently the temperature was increased to 180° C., and imidization was completed by a reaction for 5 hours. The reaction liquid was introduced into methanol, and a polymer was isolated. This was dried and then was dissolved in N-methyl-2-pyrrolidone, the solution was introduced into methanol, and the polymer was isolated again. The polymer thus isolated was dried under reduced pressure, and purified polyether amideimide in a powder form was obtained. 120 g of this polyether amideimide and 6 g of a silane coupling agent (manufactured by Dow Corning Toray Co., Ltd., trade name: SH6040) were dissolved in 360 g of N-methyl-2-pyrrolidone, and varnish Q for non-adhesive layer formation was obtained.

(Production of Temporary Protective Film)

Varnish P was applied on a support film (polyimide film, manufactured by Ube Industries, Ltd., trade name: UPILEX 25SGA, film thickness: 25 μm), and the varnish was dried by heating for 10 minutes at 100° C. and for 10 minutes at 300° C. Thus, an adhesive layer having a film thickness of 8 μm was formed. Next, varnish Q was applied on the rear surface of a support film coated with an adhesive varnish, and the varnish was dried by heating for 10 minutes at 100° C. and for 10 minutes at 300° C. Thus, a non-adhesive layer having a film thickness of 6 μm was formed. Thereby, a temporary protective film of Comparative Example 5 having an adhesive layer and a non-adhesive layer was obtained. The solid shear modulus of the temporary protective film was 21.0 MPa.

<Evaluation>

(Adhesive Force of Adhesive Layer)

(1) After Attachment at Normal Temperature (Attachability at Normal Temperature)

As lead frames, a CDA194 frame (Cu, manufactured by Shinko Electric Industries Co., Ltd.) and a CDA194 palladium-plated frame (PPF, manufactured by Shinko Electric Industries Co., Ltd.) were prepared. To these lead frames (size of 50 mm×157 mm), each of the temporary protective films of Examples and Comparative Examples was attached using a hand roller, in a direction in which the adhesive layer (size of 40 mm×160 mm) came into contact with the lead frame under the conditions of normal temperature (24° C.) and a load of 20 N. Subsequently, each of the temporary protective film was torn off at a speed of 50 mm/minute in the 180° direction from a force gauge, and the maximum value of the load at that time was recorded as the adhesive force. Thereby, the attachability (reduced pressure adhesiveness) at normal temperature of each temporary protective film was evaluated.

However, in the case of the temporary protective film of Comparative Example 5, since the attachability at normal temperature of the adhesive layer was weak, the adhesive layer was attached to the lead frame using a pressing machine that had been heated to 230° C., by adjusting the pressure to be applied to the tape to 6 MPa and applying pressure for 10 seconds (similarly performed in the following measurement of adhesive force).

(2) After Heating Treatment (Evaluation of Peelability after Heating Treatment)

As lead frames, a CDA194 frame (Cu, manufactured by Shinko Electric Industries Co., Ltd.) and a CDA194 palladium-coated frame (PPF, manufactured by Shinko Electric Industries Co., Ltd.) were prepared. To these lead frames (size of 50 mm×157 mm), each of the temporary protective films of Examples and Comparative Examples was attached using a hand roller, in a direction in which the adhesive layer (size of 40 mm×160 mm) came into contact with the lead frame under the conditions of normal temperature (24° C.) and a load of 20 N. Subsequently, the lead frame and the temporary protective film were heated in an oven in an air atmosphere while the conditions were changed to the sequence of for 60 minutes at 180° C., for 60 minutes at 200° C., and for 2 minutes at 175° C. Subsequently, each of the temporary protective films was torn off at a speed of 50 mm/minute in the 180° direction from a force gauge, and the maximum value of the load at that time was recorded as the adhesive force. Thereby, the peelability of each of the temporary protective films from the lead frame after a heating treatment under the conditions corresponding to sealing molding was evaluated.

(3) After Sealing Molding (Evaluation of Peelability after Sealing Molding)

As a lead frame, a CDA194 frame (Cu, manufactured by Shinko Electric Industries Co., Ltd.) was prepared. To the above-described lead frame (size of 50 mm×157 mm), each of the temporary protective films of Examples and Comparative Examples was attached using a hand roller, in a direction in which the adhesive layer (size of 40 mm×160 mm) came into contact with the lead frame under the conditions of normal temperature (24° C.) and a load of 20 N. Subsequently, the lead frame and the temporary protective film were heated in an oven in an air atmosphere while the conditions were changed to the sequence of for 60 minutes at 180° C. and for 60 minutes at 200° C.

Subsequently, the surface of the lead frame on the opposite side of the temporary protective film was subjected to a plasma treatment in an argon gas atmosphere (flow rate: 20 sccm) under the conditions of 150 W and 15 seconds. Subsequently, sealing molding was performed using a mold molding machine (manufactured by Apic Yamada Corp.) under the conditions of 175° C., 6.8 MPa, and 2 minutes, and a sealing layer was formed using a sealing material (trade name: GE-7470L-A, manufactured by Hitachi Chemical Co., Ltd.) on the surface of the lead frame on the opposite side of the temporary protective film.

Subsequently, each of the temporary protective films was torn off at a speed of 50 mm/minute in the 180° direction from a force gauge, and the maximum value of the load at the time when the adhesive layer was torn off from the sealing layer was recorded as the adhesive force to the sealing layer after sealing molding. Thereby, the peelability of each of the temporary protective films from the sealing layer after sealing molding was evaluated.

(4) After Curing of Sealing Layer (Evaluation of Peelability after Curing of Sealing Layer)

As lead frames, a CDA194 frame (Cu, manufactured by Shinko Electric Industries Co., Ltd.) and a CDA194 palladium-coated frame (PPF, manufactured by Shinko Electric Industries Co., Ltd.) were prepared. To these lead frames (size of 50 mm×157 mm), each of the temporary protective films of Examples and Comparative Examples was attached using a hand roller, in a direction in which the adhesive layer (size of 40 mm×160 mm) came into contact with the lead frame under the conditions of normal temperature (24° C.) and a load of 20 N. Subsequently, the lead frame and the temporary protective film were heated in an oven in an air atmosphere while the conditions were changed to the sequence of for 60 minutes at 180° C. and for 60 minutes at 200° C. The surface of the lead frame on the opposite side of the temporary protective film was subjected to a plasma treatment in an argon gas atmosphere (flow rate: 20 sccm) under the conditions of 150 W and 15 seconds. Subsequently, sealing molding was performed using a mold molding machine (manufactured by Apic Yamada Corp.) under the conditions of 175° C., 6.8 MPa, and 2 minutes, and a sealing layer was formed using a sealing material (trade name: GE-7470L-A, manufactured by Hitachi Chemical Co., Ltd.) on the surface of the lead frame on the opposite side of the temporary protective film. Furthermore, the sealing layer was cured by heating in an oven in an air atmosphere at 180° C. for 5 hours. After heating, each of the temporary protective films was torn off at a speed of 50 mm/minute in the 180° direction from a force gauge, and the maximum value of the load at the time when the adhesive layer was torn off from the sealing layer was recorded as the adhesive force to the lead frame or the sealing layer after sealing molding. Thereby, the peelability of each of the temporary protective films after curing of the sealing layer was evaluated.

(5) Adhesive Residue

Each of the temporary protective films of Examples and Comparative Examples was attached to a CDA194 frame (lead frame, manufactured by Shinko Electric Industries Co., Ltd.) in a direction in which the adhesive layer came into contact with the lead frame, under the conditions of normal temperature (24° C.) and a load of 20 N. The lead frame and the temporary protective film were heated in an oven in an air atmosphere, while the conditions were changed to the sequence of for 60 minutes at 180° C. and for 60 minutes at 200° C. Subsequently, each of the temporary protective films was torn off at a speed of 50 mm/minute in the 180° direction from a force gauge, and the maximum value of the load at that time was recorded as the adhesive force. Thereby, the peelability of each of the temporary protective films from the lead frame after a heating treatment under the conditions corresponding to sealing molding was evaluated. The surface of the lead frame on the opposite side of the temporary protective film was subjected to a plasma treatment in an argon gas atmosphere (flow rate: 20 sccm) under the conditions of 150 W and 15 seconds.

Subsequently, sealing molding was performed using a mold molding machine (manufactured by Apic Yamada Corp.) under the conditions of 175° C., 6.8 MPa, and 2 minutes, and a sealing layer was formed using a sealing material (trade name: GE-7470L-A, manufactured by Hitachi Chemical Co., Ltd.) on the surface of the lead frame on the opposite side of the temporary protective film.

Subsequently, each of the temporary protective films was torn off at a speed of 50 mm/minute in the 180° direction, and the state of adhesive residue on the sealing layer and the lead frame after tearing off was checked. The adhesive residue was rated in six grades according to the following criteria, based on the area proportion of the part where adhesive residue remained with respect to the total area combining the surfaces of the sealing layer and the lead frame.

5: 60% to 100% (the remaining adhesive layer is in general relatively thick)
4: 60% to 100% (the remaining adhesive layer is in general relatively thin)
3: more than or equal to 30% and less than 60%
2: more than or equal to 10% and less than 30%
1: more than 0% and less than 10%
0: 0%

(6) 5% Weight Reduction Temperature

The 5% weight reduction temperature of each of the temporary protective film of Examples and Comparative Examples was measured using a differential thermal balance (manufactured by Seiko Instruments, Inc., SSC5200 type) in an air atmosphere under the conditions of a rate of temperature increase of 10° C./min.

The evaluation results described above are presented in Table 3 and Table 4. The various temporary protective films of Examples could be attached to lead frames at normal temperature and could be easily peeled off from lead frames and sealing layers after sealing molding, while the adhesive residue was suppressed.

TABLE 3

| | | | | | Example | | | | | | | | | | | | | |
|---|---|---|---|---|---|---|---|---|---|---|---|---|---|---|---|---|---|---|
| | | | | 1 | 2 | 3 | 4 | 5 | 6 | 7 | 8 | 9 | 10 | 11 | 12 | 13 | 14 | 15 |
| | Varnish | | | A | B | C | D | E | F | G | H | I | J | K | L | M | A | A |
| Composition of adhesive layer (parts by mass) | Acrylic rubber | WS-023 EK30 | Ai | 70 | 70 | 70 | 70 | 70 | 70 | 0 | 100 | 70 | 70 | 70 | 70 | 30 | 70 | 70 |
| | | HTR-280 DR | Aii | 30 | 30 | 30 | 30 | 30 | 30 | 100 | 0 | 30 | 30 | 30 | 30 | 70 | 30 | 30 |
| | Peelability imparting agent | EX-614B | Bi | 10 | 10 | 0 | 50 | 30 | 0 | 10 | 10 | 5 | 0 | 0 | 5 | 0 | 10 | 10 |
| | | EX-810 | Bii | 10 | 0 | 50 | 0 | 0 | 30 | 10 | 10 | 5 | 10 | 0 | 0 | 0 | 10 | 10 |
| Solid shear modulus of temporary protective film (MPa/200° C.) | | | | 7.0 | 6.9 | 7.1 | 7.1 | 7.0 | 7.0 | 6.9 | 6.9 | 7.0 | 7.0 | 6.8 | 6.9 | 6.8 | 8.2 | 5.7 |
| Thickness of adhesive layer (μm) | | | | 2 | 2 | 2 | 2 | 2 | 2 | 2 | 2 | 2 | 2 | 2 | 2 | 2 | 1 | 5 |
| Adhesive force after attachment at normal temperature (N/m) | | | Cu | 26 | 28 | 10 | 15 | 22 | 15 | 22 | 28 | 23 | 24 | 18 | 22 | 20 | 10 | 31 |
| | | | PPF | 11 | 12 | 5 | 5 | 8 | 6 | 20 | 9 | 11 | 13 | 9 | 10 | 15 | 6 | 14 |
| Adhesive force after heating treatment (N/m) | | | Cu | 75 | 75 | 30 | 40 | 63 | 50 | 43 | 128 | 85 | 80 | 50 | 78 | 125 | 31 | 179 |
| | | | PPF | 38 | 63 | 43 | 35 | 63 | 68 | 28 | 100 | 43 | 108 | 245 | 93 | 210 | 20 | 103 |
| Adhesive force after sealing molding (N/m) | | | Sealing layer | 250 | 270 | 230 | 180 | 233 | 273 | 213 | 275 | 300 | 270 | 263 | 300 | 250 | 238 | 350 |
| Adhesive force after curing of sealing material (N/m) | | | Cu | 70 | 108 | 50 | 40 | 50 | 70 | 63 | 108 | 113 | 100 | 75 | 100 | 275 | 30 | 300 |
| | | | PPF | 100 | 98 | 30 | 20 | 63 | 75 | 18 | 100 | 75 | 150 | 263 | 120 | 265 | 40 | 325 |
| | | | Sealing layer | 270 | 300 | 250 | 150 | 170 | 290 | 250 | 288 | 300 | 300 | 345 | 308 | 375 | 257 | 437 |
| Adhesive residue | | | | 3 | 3 | 3 | 3 | 3 | 3 | 3 | 3 | 3 | 3 | 3 | 3 | 3 | 3 | 3 |
| 5% weight reduction temperature of temporary protective film (° C.) | | | | 390 | — | — | — | — | — | — | — | — | — | — | — | — | 500 | 355 |

TABLE 4

| | | | | Comparative Example | | | | |
|---|---|---|---|---|---|---|---|---|
| | | | | 1 | 2 | 3 | 4 | 5 |
| Varnish | | | | A | A | A | O | P (adhesive layer) |
| | | | | | | | | Q (non-adhesive layer) |
| Composition of adhesive layer (parts by mass) | Acrylic rubber | WS-023 EK30 | Ai | 70 | 70 | 70 | 0 | — |
| | | HTR-280 DR | Aii | 30 | 30 | 30 | 100 | — |
| | Peelability imparting agent | EX-614B | Bi | 10 | 10 | 10 | 30 | — |
| | | EX-810 | Bii | 10 | 10 | 10 | 10 | — |
| Solid shear modulus of temporary protective film (MPa/200° C.) | | | | 4.0 | 3.1 | 1.8 | 3.2 | 21.0 |
| Thickness of adhesive layer (μm) | | | | 6 | 8 | 10 | 5 | 8 (adhesive layer) |
| | | | | | | | | 6 (non-adhesive layer) |
| Adhesive force after attachment at normal temperature (N/m) | | | Cu | 36 | 39 | 42 | 13 | 25 (heat pressing) |
| | | | PPF | 18 | 23 | 27 | 15 | 5 (heat pressing) |
| Adhesive force after heating treatment (N/m) | | | Cu | 208 | 254 | 290 | 58 | 250 |
| | | | PPF | 114 | 129 | 135 | 68 | 20 |
| Adhesive force after sealing molding (N/m) | | | Sealing layer | 350 | 400 | 463 | 75 | 500 |
| Adhesive force after curing of sealing material (N/m) | | | Cu | 300 | 350 | 375 | 75 | Unpeelable |
| | | | PPF | 350 | 350 | 375 | 75 | 30 |
| | | | Sealing layer | 437 | 463 | Unpeelable | 75 | Unpeelable |
| Adhesive residue | | | | 5 | 5 | 5 | 5 | 0 |
| 5% weight reduction temperature of temporary protective film (° C.) | | | | 350 | 335 | 325 | — | 420 |

REFERENCE SIGNS LIST

1: support film, 2: adhesive layer, 3: non-adhesive layer, 10, 10': temporary protective film, 11: lead frame, 11a: die pad, 11b: inner lead, 12: wire, 13: sealing layer, 14: semiconductor element, 20: sealing molded body, 100: semiconductor device.

The invention claimed is:

1. A temporary protective film for semiconductor sealing molding, the temporary protective film comprising a support film; and an adhesive layer provided on the support film and containing an acrylic rubber,
   wherein a solid shear modulus at 200° C. of the temporary protective film is 5.0 MPa or higher.

2. The temporary protective film for semiconductor sealing molding according to claim 1, wherein the adhesive layer further contains a peelability imparting agent.

3. The temporary protective film for semiconductor sealing molding according to claim 2, wherein a content of the peelability imparting agent is more than or equal to 6 parts by mass and less than 60 parts by mass with respect to 100 parts by mass of the acrylic rubber.

4. The temporary protective film for semiconductor sealing molding according to claim 1, wherein a thickness of the adhesive layer is from 1μ m to 5 μm.

5. The temporary protective film for semiconductor sealing molding according to claim 1, wherein the support film is a polyimide film.

6. The temporary protective film for semiconductor sealing molding according to claim 1, wherein the acrylic rubber is a copolymer including at least one monomer unit selected from the group consisting of butyl (meth)acrylate, ethyl (meth)acrylate, methyl (meth)acrylate, (meth)acrylic acid, acrylonitrile, 2-hydroxyethyl (meth)acrylate, and glycidyl (meth)acrylate.

7. The temporary protective film for semiconductor sealing molding according to claim 1, wherein a weight average molecular weight of the acrylic rubber is from 450,000 to 900,000.

8. The temporary protective film for semiconductor sealing molding according to claim 1, wherein the adhesive layer has pressure-sensitive adhesiveness at 24° C.

9. The temporary protective film for semiconductor sealing molding according to claim 1, wherein the 5% weight reduction temperature of the temporary protective film is 350° C. or higher.

10. The temporary protective film for semiconductor sealing molding according to claim 1, further comprising a cover film provided on a surface of the adhesive layer, the surface being on the opposite side of the surface having the support film provided thereon.

11. A temporary protective film-attached lead frame comprising:
    a lead frame having a die pad and an inner lead; and
    the temporary protective film for semiconductor sealing molding according to claim 1,
    wherein the temporary protective film is attached to the lead frame such that the adhesive layer of the temporary protective film comes into contact with one surface of the lead frame.

12. A temporary protective film-attached sealing molded body comprising:
    a lead frame having a die pad and an inner lead;
    a semiconductor element mounted on the die pad;
    a wire connecting the semiconductor element and the inner lead;
    a sealing layer sealing the semiconductor element and the wire; and
    the temporary protective film for semiconductor sealing molding according to claim 1,
    wherein the temporary protective film is attached such that the adhesive layer of the temporary protective film is attached to a surface of the lead frame, the surface of the lead frame to which the adhesive layer of the temporary protective film is attached being on the opposite side of the lead frame from the surface of the lead frame having the semiconductor element mounted thereon.

13. A method for producing a semiconductor device, the method comprising, in the following order:
    attaching the temporary protective film for semiconductor sealing molding according to claim 1 to one surface of a lead frame having a die pad and an inner lead in a direction of the adhesive layer coming into contact with the lead frame;
    mounting a semiconductor element on a surface of the die pad on the opposite side of the lead frame from the one surface to which the adhesive layer of the temporary protective film is attached;
    providing a wire for connecting the semiconductor element and the inner lead;
    forming a sealing layer for sealing the semiconductor element and the wire, and thereby obtaining a sealing molded body having the lead frame, the semiconductor element, and the sealing layer; and
    peeling off the temporary protective film from the sealing molded body.

14. The method according to claim 13, wherein
    the lead frame has a plurality of the die pads, the semiconductor element is mounted on each of the multiple die pads, and
    the method further comprises dividing the sealing molded body before or after the temporary protective film is peeled off from the sealing molded body, and thereby obtaining a semiconductor device having one die pad and one semiconductor element described above.

* * * * *